United States Patent [19]

Wietecha et al.

[11] Patent Number: 5,736,885
[45] Date of Patent: Apr. 7, 1998

[54] OFFSET ADJUSTMENT FOR FULLY DIFFERENTIAL AMPLIFIERS

[76] Inventors: Stanley Frank Wietecha, 5 Barber Blvd., South Bound Brook, N.J. 08880; Thomas D. Housten, 86 Windy Way, Sommerville, N.J. 08876; John A. Olmstead, 362 Dennisville Rd., Cape May Court House, N.J. 08880

[21] Appl. No.: 494,395

[22] Filed: Jun. 26, 1995

[51] Int. Cl.$^6$ .................................................. H03F 3/45
[52] U.S. Cl. ........................ 327/307; 327/563; 327/362; 327/89; 330/253; 330/261; 379/399
[58] Field of Search ............................... 330/261, 253; 327/307, 560, 561, 562, 563, 362, 65, 66, 89, 403, 404, 405, 432, 489, 433; 379/399

[56] References Cited

U.S. PATENT DOCUMENTS

| | | | |
|---|---|---|---|
| 4,072,870 | 2/1978 | Davis | 327/65 |
| 4,308,504 | 12/1981 | Ida | 330/253 |
| 5,142,242 | 8/1992 | Schaffer | 330/257 |
| 5,148,119 | 9/1992 | Wright et al. | 330/260 |
| 5,180,932 | 1/1993 | Bengel | 327/362 |
| 5,266,852 | 11/1993 | Shigenari et al. | 327/309 |
| 5,343,163 | 8/1994 | Linder et al. | 330/252 |
| 5,365,191 | 11/1994 | Hayashi | 330/252 |
| 5,436,594 | 7/1995 | Pace et al. | 330/258 |
| 5,465,070 | 11/1995 | Koyama et al. | 327/350 |
| 5,488,321 | 1/1996 | Johnson | 327/66 |
| 5,528,171 | 6/1996 | Doi et al. | 326/66 |
| 5,587,674 | 12/1996 | Danstrom | 327/67 |

*Primary Examiner*—Timothy P. Callahan
*Assistant Examiner*—Terry L. Englund

[57] ABSTRACT

A circuit for providing an input offset voltage to balance a fully differential amplifier may include two field effect transistors (FETs) in parallel conductive paths for receiving a current, an amplifier current source, a resistor connecting the FETs at their drains, and a second amplifier with inputs for an offset correction voltage and for a reference voltage on which the fully differential amplifier is to be balanced and outputs for providing control inputs to the FETs. The input offset voltage for balancing the fully differential amplifier is the difference between currents in the parallel paths times the resistance of the resistor. The circuit may be used to balance a fully differential amplifier in a telephone CODEC. The correction voltage may correct the total offset from the CODEC, or the offset introduced by a sign bit integrator that provides a correction for excursions of the same polarity in the CODEC.

7 Claims, 1 Drawing Sheet

& # 1

OFFSET ADJUSTMENT FOR FULLY DIFFERENTIAL AMPLIFIERS

BACKGROUND OF THE INVENTION

The present invention is related to circuits for balancing operational amplifiers, and more particularly to a circuit for providing an input offset voltage to balance a fully differential amplifier.

A differential operational amplifier is perfectly balanced when the difference in the voltage outputs is zero or halfway between supply voltages when the inputs are both zero. It is desirable to achieve this perfect balance for a variety of uses, such as in operational amplifiers used in telephone system CODECs. However, operational amplifiers are not perfectly balanced for a variety of reasons, and must be corrected. The amount that an amplifier is out of balance is its offset, and the correction applied is the offset correction. The present invention is directed to correcting a voltage offset present at the two outputs of a fully differential amplifier.

An operational amplifier is a fully differential amplifier when it has two inputs and two outputs, and when neither of the outputs are connected to a ground reference.

While various methods for correcting offsets in non-fully differential operational amplifiers are known, correction of offsets in fully differential amplifiers has been more difficult because both outputs must be referenced to a reference voltage. For example, in a telephone system CODEC both outputs must be referenced to an internal mid-rail reference.

Many analog systems requiring operational amplifiers use fully differential amplifiers, rather than traditional single-ended operational amplifiers, because the fully differential amplifiers can be operated at lower supply voltages, and because the power supply rejection of noise is improved. A significant application for fully differential amplifiers is found in telephone systems CODECs in which large offsets may produce errors that degrade system performance.

Accordingly, it is an object of the present invention to provide a novel circuit for providing an input offset voltage to balance a fully differential amplifier that obviates the problems of the prior art.

It is another object of the present invention to provide a novel circuit for balancing a fully differential amplifier in which two transistors in parallel conductive paths for receiving a current from a current source for the amplifier are controlled by a second amplifier with inputs for an offset correction voltage and for a reference voltage on which the fully differential amplifier is to be balanced.

It is yet another object of the present invention to provide a novel circuit for balancing a fully differential amplifier in a CODEC for a telephone system in which the reference voltage is a mid-rail reference voltage and the offset correction voltage is for correcting a sign-bit integration offset.

It is still another object of the present invention to provide a novel circuit for providing an input offset voltage to balance a fully differential amplifier in which two transistors in parallel paths that receive a current from an amplifier current source are connected by a resistor, and in which the input offset voltage is the difference between the currents in the two parallel paths times the resistance of the resistor.

These and many other objects and advantages of the present invention will be readily apparent to one skilled in the art to which the invention pertains from a perusal of the claims, the appended drawings, and the following detailed description of the preferred embodiments.

DESCRIPTION OF PREFERRED EMBODIMENTS

Figure 1:
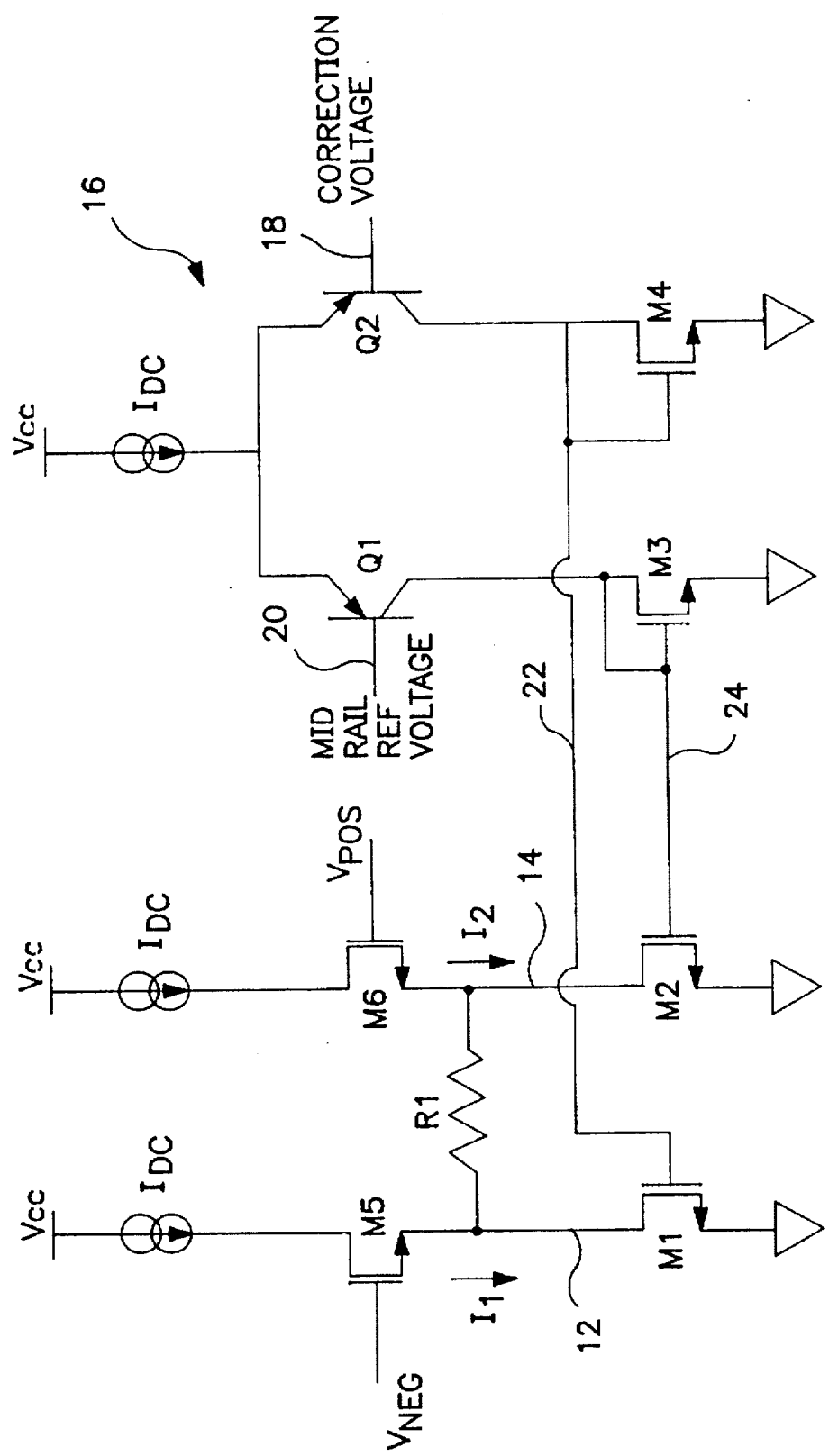
FIG. 1 is a circuit diagram of an embodiment of the present invention.

With reference now to FIG. 1, an embodiment of the present invention for providing an input offset voltage to balance a fully differential amplifier may include a current source $I_{DC}$ for the fully differential amplifier, two field effect transistors (FETs) M1 and M2 in parallel conductive paths 12 and 14 for receiving a current from current source $I_{DC}$ (shown as three sources in FIG 1, although it may be one or more sources) a resistor R1 connecting FETs M1 and M2 at their drains, and a second amplifier 16 with inputs 18 and 20 for an offset correction voltage and for a reference voltage on which the fully differential amplifier is to be balanced and outputs 22 and 24 for providing control inputs to the gates of FETs M1 and M2. The input offset voltage for balancing the fully differential amplifier is the difference between the currents in parallel paths 12 and 14 multiplied by resistance of resistor R1. That is, $$\text{Input offset voltage} = (I_2 - I_2) * R1 \tag{1}$$

Second amplifier 16 may include a FET M3 having its drain connected to the collector of transistor Q1 which has its base connected to the reference voltage at input 20 and a second FET M4 having its drain connected to the collector of transistor Q2 which has its base connected to the offset correction voltage at input 18. Each of FETs M3 and M4 have their gates connected to their drains.

In this embodiment, the gate of FET M3 is connected to the control terminal of FET M2. Path 14 is the parallel path that is connected to a positive input terminal $V_{POS}$ of the fully differential amplifier through FET M6. The gate of FET M4 is connected to the control terminal of FET M1. Path 12 is the parallel path that is connected to a negative input terminal $V_{NEG}$ of the fully differential amplifier through a further FET M5.

Second amplifier 16 may also include a first bipolar transistor Q1 with a base for receiving the reference voltage and second bipolar transistor Q2 with a base for receiving the offset correction voltage. The collectors of bipolar transistors Q1 and Q2 may be connected to the drains of FETs M3 and M4, respectively.

The FETs in the embodiment of FIG. 1 are N-MOS type, and the bipolar transistors are PNP type, although the opposite type may also be used.

In a preferred embodiment the circuit provides an input offset voltage to balance a fully differential amplifier in a telephone system CODEC having a mid-rail reference voltage. In a CODEC the most convenient place to correct for an accumulation of offsets is at the end of the CODEC's series string of functional blocks. In a typical CODEC this would be either in the last stage of the high pass filter or at the comparator of the analog-to-digital converter. The correction voltage applied to input 18 of bipolar transistor Q2 may be a correction for the total offset.

CODECs may also take the sign bit and integrate it to provide a correction for excursions of the same polarity. The generation of the sign bit correction produces a small voltage which is an offset that also must be corrected. As is known, the sign bit correction may be a voltage of equal magnitude and opposite polarity to the small voltage offset. This sign bit correction voltage may be the correction voltage applied to input 18 at bipolar transistor Q2.

While preferred embodiments of the present invention have been described, it is to be understood that the embodiments described are illustrative only and the scope of the invention is to be defined solely by the appended claims when accorded a full range of equivalence, many variations and modifications naturally occurring to those of skill in the art from a perusal hereof.

What is claimed is:

1. A circuit for providing an input offset voltage to balance a fully differential amplifier having a current source, the circuit comprising:

two supply transistors in parallel conductive paths;

a resistor connecting said two supply transistors; and a second amplifier comprising a first field effect transistor having its drain connected to a first bipolar transistor having its base connected for control by a reference voltage and a second field effect transistor having its drain connected to a second bipolar transistor having its base connected for control by a correction voltage, said first and second field effect transistors each respectively having their gate connected to their drain, the gates of said first and second field effect transistors being connected for providing control inputs to respective control terminals of said two supply transistors, wherein the input offset voltage for balancing the fully differential amplifier is the difference between the currents in said two parallel paths multiplied by the resistance of said resistor.

2. The circuit of claim 1 wherein said gate of said first field effect transistor is connected for controlling a first of said two supply transistors in a one of said parallel paths that is connected to a first input transistor for receiving a positive input terminal of the fully differential amplifier, and wherein said gate of said second field effect transistor is connected for controlling a second of said two supply transistors in a one of said parallel paths that is connected to a second input transistor for receiving a negative input of the fully differential amplifier.

3. The circuit of claim 1 in a CODEC for a telephone system in which the reference voltage is a mid-rail reference voltage of the CODEC and the offset correction voltage is a sign-bit integration offset voltage correction.

4. The circuit of claim 1 wherein said two supply transistors are field effect transistors of the same type.

5. A circuit for balancing a fully differential amplifier in a telephone system CODEC having a mid-rail reference voltage and a current source, the circuit comprising:

two field effect transistors in parallel conductive paths and having drains connected to different sources of a pair of transistors in the fully differential amplifier;

a resistor connecting said drains of said two field effect transistors; and a correction circuit comprising, a first bipolar transistor having a base for receiving an offset correction voltage from a sign-bit integrator and a second bipolar transistor having a base for receiving the mid-rail reference voltage, said first and second bipolar transistors having a common emitter, and a first field effect transistor having its drain connected to the collector of said first bipolar transistor and a second field effect transistor having its drain connected to the collector of said second bipolar transistor, said gate of said first field effect transistor being connected for controlling a first of said two field effect transistors in parallel conductive paths of the fully differential amplifier, and said gate of said second field effect transistor being connected for controlling a second of said two field effect transistors in parallel conductive paths of the fully differential amplifier, wherein the difference between the currents in said two parallel paths multiplied by the resistance of said resistor provides an input offset voltage for balancing the fully differential amplifier.

6. The circuit of claim 5 wherein said field effect transistors are N-MOS type, and wherein all of said bipolar transistors are PNP type.

7. A circuit for generating currents for controlling two supply transistors which are in separate supply paths of resistor coupled sources of a pair of input transistors in a fully differential amplifier, the circuit comprising:

a first pair of transistors with their emitters coupled to a current source of the fully differential amplifier, wherein one transistor of said first pair of transistors has its base connected to be controlled by a reference voltage and the other transistor of said first pair of transistors has its base connected to be controlled by a correction voltage; and a second pair of transistors with each of their drains connected to their gates and each of said drains connected to a different one of the collectors of said first pair of transistors, each of said gates being connected to a different gate of the two supply transistors for controlling operation thereof.

* * * * *